United States Patent
Do

(10) Patent No.: US 9,664,520 B2
(45) Date of Patent: May 30, 2017

(54) APPARATUS AND METHOD FOR GENERATING ASSISTANCE DATA WITH VERTICAL ACCESS AREAS AND PREDICTED VERTICAL MOVEMENT MODELS

(71) Applicant: QUALCOMM Incorporated, San Diego, CA (US)

(72) Inventor: Ju-Yong Do, Palo Alto, CA (US)

(73) Assignee: QUALCOMM Incorporated, San Diego, CA (US)

( * ) Notice: Subject to any disclaimer, the term of this patent is extended or adjusted under 35 U.S.C. 154(b) by 836 days.

(21) Appl. No.: 14/092,650

(22) Filed: Nov. 27, 2013

(65) Prior Publication Data

US 2015/0149133 A1 May 28, 2015

(51) Int. Cl.
G06F 17/50 (2006.01)
G01C 21/20 (2006.01)
G01S 5/02 (2010.01)

(52) U.S. Cl.
CPC .......... *G01C 21/206* (2013.01); *G01S 5/0236* (2013.01); *G01S 5/0278* (2013.01); *G06F 17/5036* (2013.01)

(58) Field of Classification Search
USPC .................................................. 703/2, 6, 18
See application file for complete search history.

(56) References Cited

U.S. PATENT DOCUMENTS

| 8,207,851 | B2 | 6/2012 | Christopher | |
|---|---|---|---|---|
| 9,037,131 | B2 * | 5/2015 | Park | H04W 16/20 455/422.1 |
| 9,179,387 | B2 * | 11/2015 | Hedqvist | H04W 36/32 |
| 2009/0191878 | A1 * | 7/2009 | Hedqvist | H04W 36/32 455/441 |
| 2009/0216438 | A1 | 8/2009 | Shafer | |
| 2011/0121963 | A1 | 5/2011 | Prehofer | |

(Continued)

FOREIGN PATENT DOCUMENTS

WO 2013065042 A1 5/2013

OTHER PUBLICATIONS

International Search Report and Written Opinion—PCT/US2014/060968—ISA/EPO—Feb. 3, 2015.

*Primary Examiner* — Thai Phan
(74) *Attorney, Agent, or Firm* — Silicon Valley Patent Group LLP

(57) ABSTRACT

Assistance data for indoor positioning is generated with vertical access areas, such as stairs, elevators, and escalators, identified along with predicted vertical movement models for the vertical access area. The predicted vertical movement models provide probabilities of movement to different floors by the vertical access areas. The assistance data may be generated by acquiring a floor plan data for a structure having multiple floors and analyzing the floor plan data to detect vertical access areas. The predicted vertical movement model for the vertical access area may then be generated and included in the assistance data along with the vertical access area. Mobile devices using the assistance data may provide vertical access area feedback information that may be used to modify the assistance data. For example, the probability of movement to different floors by a vertical access area may be modified, or additional vertical access areas identified.

43 Claims, 6 Drawing Sheets

(56) References Cited

U.S. PATENT DOCUMENTS

2011/0200023 A1    8/2011   Murray et al.
2012/0166147 A1    6/2012   Kwak
2013/0116966 A1    5/2013   D'Jesus Bencci et al.
2013/0166202 A1    6/2013   Bandyopadhyay et al.
2013/0297198 A1   11/2013   Vande Velde et al.

* cited by examiner

APPARATUS AND METHOD FOR GENERATING ASSISTANCE DATA WITH VERTICAL ACCESS AREAS AND PREDICTED VERTICAL MOVEMENT MODELS

BACKGROUND

Background Field

The present disclosure relates generally to generating assistance data for positioning and location based services, and in particular, to generating assistance data that includes vertical access information with probabilities of vertical movement.

Relevant Background

Indoor positioning and location based services typically use Received Signal Strength Indicator (RSSI) and/or Round Trip Time (RTT) measurements from access points to determine a position of a mobile device. Assistance data is used to provide a map of the indoor location as well as known positions of the access points. Location based services use the RSSI and/or RTT measurements from access points, as well as the positions of the access points obtained from the assistance data to estimate a position of the mobile device with respect to the map.

Typically, however, the maps used in indoor location based services are two-dimensional, i.e., each floor of a building is independently mapped. Floor changes are generally detected by, e.g., the increased signal strength from access points on different floors. For example, when a mobile device changes from a first floor to a second floor of a building, the signal strength from access points on the first floor will decrease, while the signal strength of access points on the second floor will increase. Based on changes in the received signals, it may be determined that the mobile device is no longer on the first floor, but is now on the second floor. Relying on measurements from received signals to detect floor changes, however, may produce incorrect results. For example, in some locations in a building, such as areas that are open between floors, e.g., areas with balconies, a mobile device may receive strong signals from access points that are on floors that are different than the floor upon which the mobile device is located. Consequently, the mobile device may incorrectly determine that it has changed floors. Conversely, the mobile device may, in fact, have changed floors, but may still be receiving strong signals from access points on the previous floor, which may cause the mobile device to fail to recognize the floor change.

SUMMARY

Assistance data for indoor positioning is generated with vertical access areas, such as stairs, elevators, and escalators, identified along with predicted vertical movement models for the vertical access area. The predicted vertical movement models provide probabilities of movement to different floors by the vertical access areas. The assistance data may be generated by acquiring a floor plan data for a structure having multiple floors and analyzing the floor plan data to detect vertical access areas. The predicted vertical movement model for the vertical access area may then be generated and included in the assistance data along with the vertical access area. Mobile devices using the assistance data may provide vertical access area feedback information that may be used to modify the assistance data. For example, the probability of movement to different floors by a vertical access area may be modified, or additional vertical access areas identified.

In one implementation, a method includes acquiring floor plan data for a structure having multiple floors; analyzing the floor plan data to detect a vertical access area on a floor; generating a predicted vertical movement model for the vertical access area, the predicted vertical movement model providing probabilities of movement to different floors by the vertical access area; and generating assistance data for indoor positioning using the floor plan data, the vertical access area and the predicted vertical movement model for the vertical access area.

In another implementation, an apparatus includes an external interface for receiving a floor plan data; and a processor coupled to the external interface, the processor being configured to acquire floor plan data for a structure having multiple floors with the external interface, analyze the floor plan data to detect a vertical access area on a floor, generate a predicted vertical movement model for the vertical access area, the predicted vertical movement model providing probabilities of movement to different floors by the vertical access area, and generate assistance data for indoor positioning using the floor plan data, the vertical access area and the predicted vertical movement model for the vertical access area.

In another implementation, an apparatus includes means for acquiring floor plan data for a structure having multiple floors; means for analyzing the floor plan data to detect a vertical access area on a floor; means for generating a predicted vertical movement model for the vertical access area, the predicted vertical movement model providing probabilities of movement to different floors by the vertical access area; and means for generating assistance data for indoor positioning using the floor plan data, the vertical access area and the predicted vertical movement model for the vertical access area.

In another implementation, a non-transitory computer-readable medium including program code stored thereon, includes program code to acquire floor plan data for a structure having multiple floors; program code to analyze the floor plan data to detect a vertical access area on the floor; program code to generate a predicted vertical movement model for the vertical access area, the predicted vertical movement model providing probabilities of movement to different floors by the vertical access area; and program code to generate assistance data for indoor positioning using the floor plan data, the vertical access area and the predicted vertical movement model for the vertical access area.

In another implementation, a method includes receiving vertical access area feedback information from one or more mobile devices using assistance data for indoor positioning for a structure having multiple floors, the vertical access area feedback information comprising an identification of one or more floors accessed at an estimated position in the structure; designating an area around the estimated position as a vertical access area; generating a predicted vertical movement model for the vertical access area, the predicted vertical movement model providing probabilities of movement to different floors; and modifying the assistance data to include the vertical access area and the predicted vertical movement model for the vertical access area.

In another implementation, an apparatus includes an external interface capable of receiving vertical access area feedback information from mobile devices; and a processor coupled to the external interface, the processor being configured to receive by the external interface vertical access area feedback information from one or more mobile devices using the assistance data for indoor positioning for a structure having multiple floors, the vertical access area feedback information comprising an identification of one or more floors accessed at an estimated position in the structure; designate an area around the estimated position as a vertical access area; generate a predicted vertical movement model for the vertical access area, the predicted vertical movement model providing probabilities of movement to different floors; and modify the assistance data to include the vertical access area and the predicted vertical movement model for the vertical access area.

In another implementation, an apparatus includes means for receiving vertical access area feedback information from one or more mobile devices using the assistance data for indoor positioning for a structure having multiple floors, the vertical access area feedback information comprising an identification of one or more floors accessed at an estimated position in the structure; means for designating an area around the estimated position as a vertical access area; means for generating a predicted vertical movement model for the vertical access area, the predicted vertical movement model providing probabilities of movement to different floors; and means for modifying the assistance data to include the vertical access area and the predicted vertical movement model for the vertical access area.

In another implementation, a non-transitory computer-readable medium including program code stored thereon, includes program code to receive vertical access area feedback information from one or more mobile devices using the assistance data for indoor positioning for a structure having multiple floors, the vertical access area feedback information comprising an identification of one or more floors accessed at an estimated position in the structure; program code to designate an area around the estimated position as a vertical access area; program code to generate a predicted vertical movement model for the vertical access area, the predicted vertical movement model providing probabilities of movement to different floors; and program code to modify the assistance data to include the vertical access area and the predicted vertical movement model for the vertical access area.

In another implementation, a method includes receiving assistance data for indoor positioning for a structure with multiple floors, the assistance data including identification of a vertical access area on a floor of the structure and a predicted vertical movement model for the vertical access area, the predicted vertical movement model providing probabilities of movement to different floors by the vertical access area; determining an estimated position of a mobile device to be at the vertical access area; detecting vertical movement of the mobile device at the estimated position; and transmitting vertical access area feedback information comprising the vertical movement of the mobile device at the estimated position.

In another implementation, a mobile device includes a wireless interface; a processor coupled to the wireless interface, the processor being configured to receive assistance data for indoor positioning for a structure with multiple floors, the assistance data including identification of a vertical access area on a floor of the structure and a predicted vertical movement model for the vertical access area, the predicted vertical movement model providing probabilities of movement to different floors by the vertical access area; determine an estimated position of the mobile device to be at the vertical access area based on the assistance data and wireless signals received by the wireless interface; detect vertical movement of the mobile device at the estimated position based on the assistance data and wireless signals received by the wireless interface; and to cause the wireless interface to transmit vertical access area feedback information comprising the vertical movement of the mobile device at the estimated position.

In another implementation, a mobile device includes means for receiving assistance data for indoor positioning for a structure with multiple floors, the assistance data including identification of a vertical access area on a floor of the structure and a predicted vertical movement model for the vertical access area, the predicted vertical movement model providing probabilities of movement to different floors by the vertical access area; means for determining an estimated position of the mobile device to be at the vertical access area; means for detecting vertical movement of the mobile device at the estimated position; and means for transmitting vertical access area feedback information comprising the vertical movement of the mobile device at the estimated position.

In another implementation, a non-transitory computer-readable medium including program code stored thereon, comprising program code to receive assistance data for indoor positioning for a structure with multiple floors, the assistance data including identification of a vertical access area on a floor of the structure and a predicted vertical movement model for the vertical access area, the predicted vertical movement model providing probabilities of movement to different floors by the vertical access area; program code to determine an estimated position of a mobile device to be at the vertical access area; program code to detect vertical movement of the mobile device at the estimated position; and program code to transmit vertical access area feedback information comprising the vertical movement of the mobile device at the estimated position.

DETAILED DESCRIPTION

Figure 1:
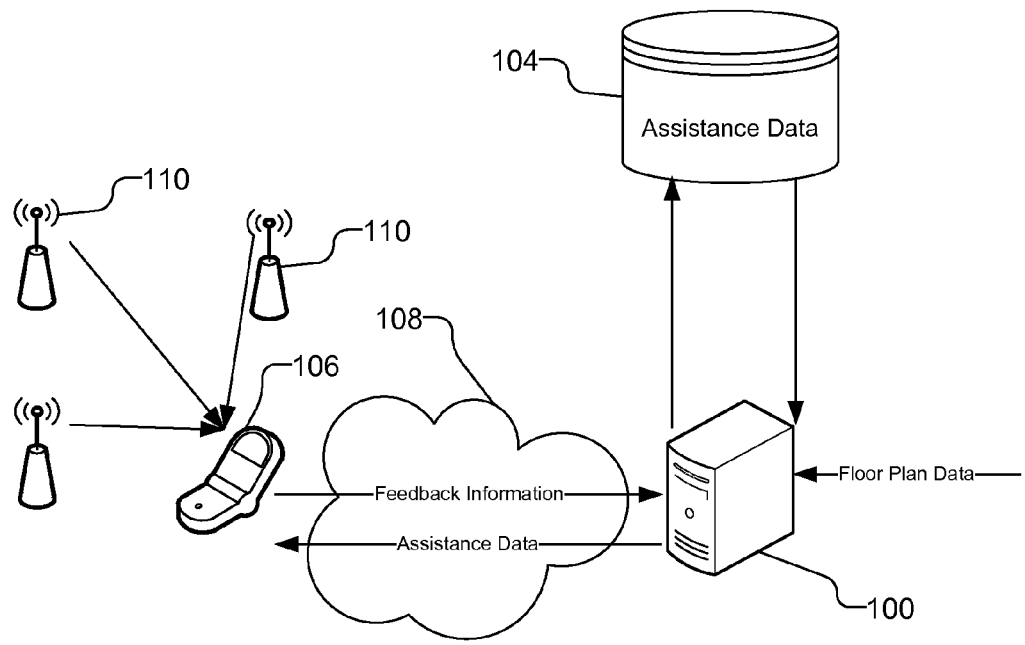
FIG. 1 illustrates a block diagram showing a system in which a server may generate assistance data for an indoor positioning that includes a map of a floor plan with a designated vertical access area and a predicted vertical movement model for the vertical access area.

FIG. 1 illustrates a block diagram showing a system in which a server 100 may generate assistance data for indoor positioning that includes a map of a floor plan with a designated vertical access area and a predicted vertical movement model for the vertical access area. The server 100 receives floor plan data for a structure that includes multiple floors. Vertical access areas, such as elevators, stairs, or escalators, may be identified from the floor plan data and predicted vertical movement models that provide probabilities of movement to different floors of the structure via the vertical access areas is generated. The server 100 may generate assistance data for indoor positioning using the floor plan data, the vertical access area and the predicted vertical movement model for the vertical access area and store the resulting assistance data e.g., in a database 104.

The server 100, or a different server, may provide the assistance data stored in database 104 to a mobile device 106 upon request, e.g., through a wireless network 108. The mobile device 106 may use the received assistance data along with measurements of signals received from access points 110 to estimate its current position. For example, with vertical access areas correctly identified in the assistance data map, floor change occurrences of a mobile device 106 during positioning and location based services may be limited to times when the estimated position of the mobile device 106 coincides with the location of the vertical access area. Thus, a floor change may be considered more likely when the estimated position of the mobile device is proximate or coincides with a vertical access area on the map and less likely when the mobile device is not proximate to or does not coincide with the vertical access area on the map. Moreover, the predicted vertical movement model for the vertical access area may be used by the mobile device 106 to predict which floor the mobile device 106 has moved to, thereby reducing the time required to determine which floor the mobile device 106 is on. Furthermore, the mobile device may use information about the vertical access areas to turn on and off processing of vertical transitions, vertical transition sensors, such as barometer sensors, or adjust the schedule for performing scans of access points. For example, if the mobile device is outside of a vertical access area, the mobile device may scan only access points that are on the current floor, or may scan access points on other floors every few minutes, e.g., 1-5 minutes. If the mobile device is inside a vertical access area, the mobile device may scan access points from other floors, e.g., every few seconds. Alternatively, a mobile device may adjust the scanning schedule based on the distance to the nearest vertical access area. For example, the mobile device may scan access points on other floors every 5 minutes if the mobile device is more than 100 m away from vertical access area, scan every 20 seconds if less than 20 m away from a vertical access point, and every 5 seconds if inside of a vertical access area. Similarly, the mobile device may turn on a barometer or other vertical transition sensor when inside or near, e.g., less than 20 m from a vertical access area.

Additionally, the mobile device 106 may verify the vertical access areas and the predicted vertical movement model in the assistance data and provide vertical access area feedback information to the server 100 (or a different server) in order to validate, invalidate, or update the predicted vertical movement model for a vertical access area in the assistance data.

Figure 2:
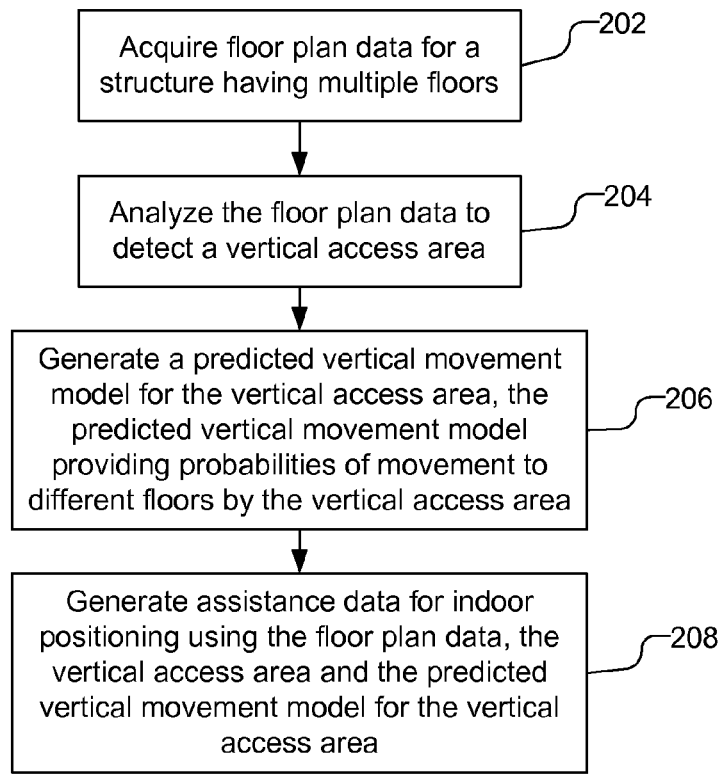
FIG. 2 is a flow chart illustrating a method of generating assistance data with designated vertical access areas and predicted vertical movement models for the vertical access areas.

FIG. 2 is a flow chart illustrating a method of generating assistance data with designated vertical access areas and predicted vertical movement models for the vertical access areas. As illustrated, floor plan data for a structure having multiple floors is acquired (202). The floor plan data may be acquired, e.g., from the building owner or from previously generated assistance data. The floor plan data is analyzed to detect vertical access areas (204), which may be, e.g., elevators, stairs, or escalators. By way of example, the floor plan data may be analyzed manually to identify vertical access areas. Other methods of may alternatively be used to identify vertical access areas including image processing, such as object recognition. For example, if the floor plan data is in the form of images of the floor plan, such as blue prints or a facility map, pattern matching may be used identify the vertical access area in the floor plan based on a database of vertical access area objects. Moreover, the type of vertical access area, e.g., elevators, stairs, or escalators, may be identified from the image processing.

Figure 3:
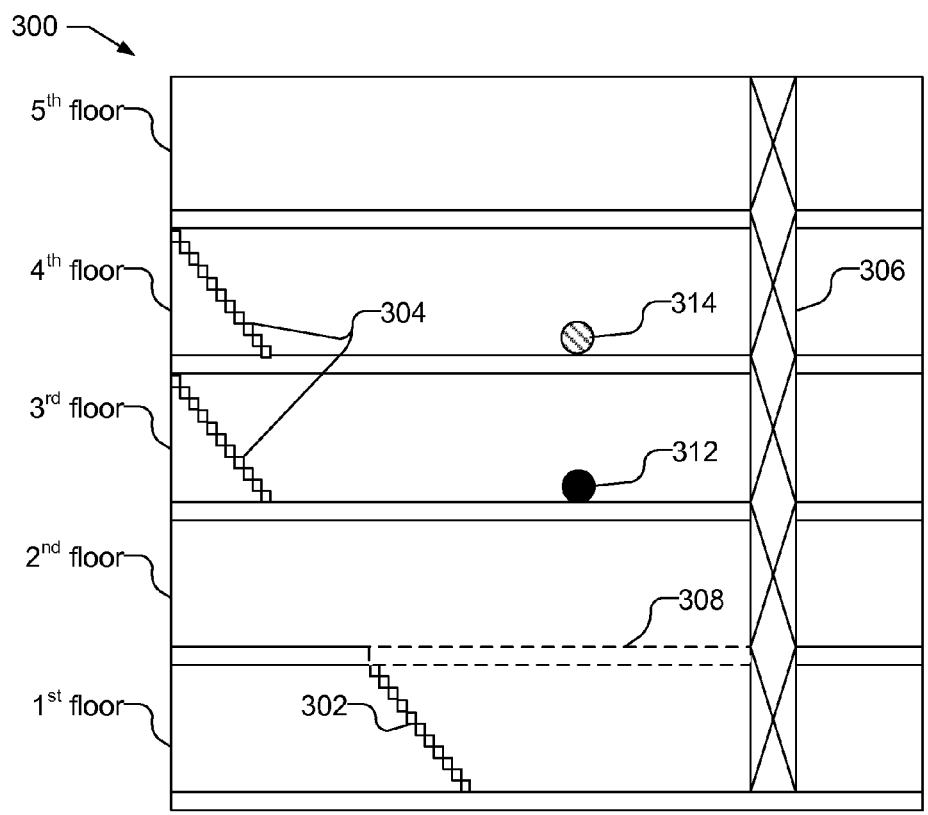
FIG. 3 illustrates a side view of the multi-floor structure with vertical access areas between floors.
Figure 4:
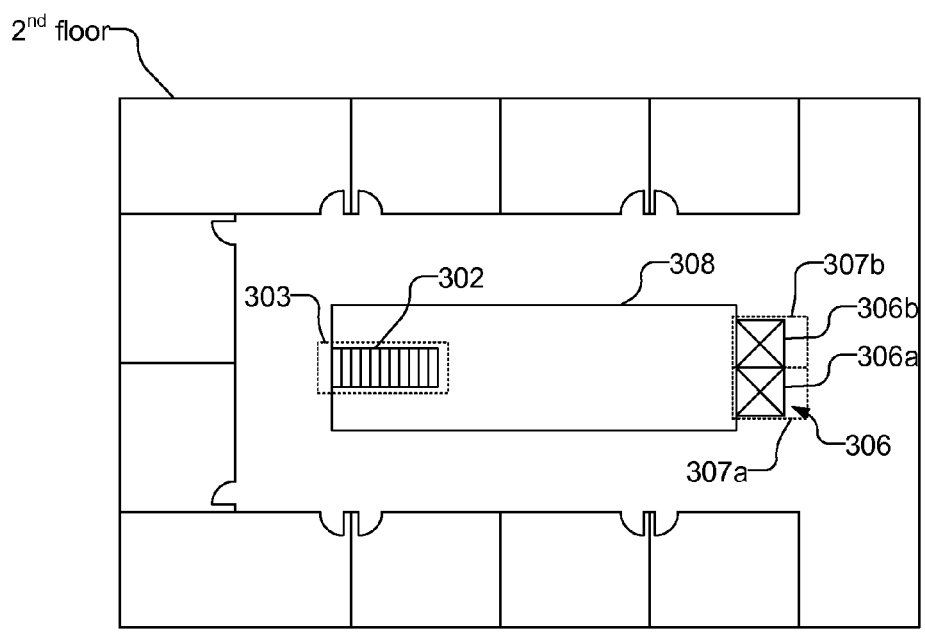
FIG. 4 illustrates a floor plan image of the $2^{nd}$ floor of the multi-floor structure from FIG. 3, and illustrates a number of vertical access areas, including the stairs and a bank of elevators.

FIG. 3, by way of example, illustrates a side view of the multi-floor structure 300 that includes a number of floors, labeled $1^{st}$ floor, $2^{nd}$ floor, $3^{rd}$ floor, $4^{th}$ floor, and $5^{th}$ floor. Stairs 302 provide vertical access between the $1^{st}$ floor and the $2^{nd}$ floor, stairs 304 provide vertical access between the $3^{rd}$ floor, $4^{th}$ floor, and $5^{th}$ floor, and a bank of elevators 306 provides vertical access between all of the floors. An open area 308 between the $1^{st}$ floor and the $2^{nd}$ floor is illustrated by dashed lines. Each floor of the multi-floor structure 300 will have a floor plan image that may be analyzed to detect vertical access areas. FIG. 4, by way of example, illustrates a floor plan image of the $2^{nd}$ floor of the multi-floor structure 300 from FIG. 3, showing a number of rooms as well as a number of vertical access areas, including the stairs 302 the bank of elevators 306, including elevators 306a and 306b, and the open area 308. By way of example, vertical access area 303 that coincides with stairs 302, and vertical access areas 307a and 307b that coincide with elevators 306a and 306b, respectively, are illustrated with dotted lines in FIG. 4.

Figure 5:
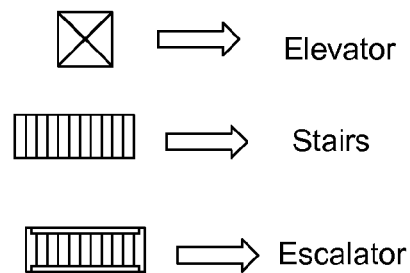
FIG. 5 illustrates a database of vertical access area types, including an elevator, stairs and escalator.

Object recognition may be performed on the floor plan image of the $2^{nd}$ floor (as well as the remaining floors of the multi-floor structure) to detect the vertical access areas using a database of vertical access area types. FIG. 5, by way of example, illustrates a database of vertical access area types, including an elevator, stairs and escalator, which may be used for pattern matching with the floor plan image shown in FIG. 4 to identify vertical access areas as well as the vertical access types. The database of vertical access area types may be generated based on the specific floor plan being processed or may be a generalized database based on commonly used designations for vertical access areas.

Referring back to FIG. 2, a predicted vertical movement model for the vertical access area is generated (206). The predicted vertical movement model provides probabilities of movement to different floors by the vertical access area. For example, a single flight of stairs, such as stairs 302 on the $2^{nd}$ floor shown in FIG. 4, has a high probability of movement to the $1^{st}$ floor and a very low probability of movement to the $3^{rd}$ floor, $4^{th}$ floor, or $5^{th}$ floor. Thus, the vertical access area 303 associated with stairs 302 on the $2^{nd}$ floor may have a predicted vertical movement model with a high probability, e.g., 95%, of decreasing floor position by one floor, a low (but non-zero) probability, e.g., 5%, of not changing floor position, and a vanishingly small probability, e.g., 0%, of increasing floor position.

The predicted movement model may be more complex for vertical access areas that are capable of accessing multiple floors. For example, elevators 306a and 306b are capable of accessing all floors of the multi-floor structure 300. However, certain floors in the multi-floor structure 300 may be accessed less than others. By way of example, the $3^{rd}$ floor of the multi-floor structure 300 may be a used for storage and the $4^{th}$ floor may have significantly fewer occupants than other occupied floors. Accordingly, the probability that the elevators 306a and 306b will access the $1^{st}$ floor, $2^{nd}$ floor or $5^{th}$ floor is significantly greater than the probability that the elevators 306a and 306b will access the $3^{rd}$ floor or the $4^{th}$ floor. Accordingly, vertical access areas 307a and 307b, associated with elevators 306a and 306b, may have different probabilities of accessing different floors of the multi-floor structure 300. Table 1 below illustrates predicted vertical movement models for the vertical access areas 303 and 307a/307b on the $2^{nd}$ floor of the multi-floor structure 300. As can be seen, it may be predicted that when a mobile device 106 is estimated to be at the vertical access area 307a associated with elevator 306, there is a higher probability that the mobile device 106 will move vertically to the $1^{st}$ floor than any other floor.

TABLE 1

| | Vertical Access Area (303) | Vertical Access Area (307a and 307b) |
|---|---|---|
| $5^{th}$ Floor | 0% | 20% |
| $4^{th}$ Floor | 0% | 15% |
| $3^{rd}$ Floor | 0% | 10% |
| $2^{nd}$ Floor | 5% | 5% |
| $1^{st}$ Floor | 95% | 50% |

Similar predicted vertical movement models may be produced for all vertical access areas on each floor of the multi-floor structure. By way of example, a predicted vertical movement model for a vertical access area associated with stairs 304 on the $5^{th}$ floor (shown in FIG. 4) is illustrated in Table 2 below. As can be seen, it may be predicted that when a mobile device 106 is estimated to be at the vertical access area associated with stairs 304 on the $5^{th}$ floor, there is a higher probability that the mobile device 106 will move vertically to the $3^{rd}$ floor (the storage floor) than the $4^{th}$ floor (the unoccupied floor).

TABLE 2

| Vertical Access Area associated with stairs 304 on the 5th floor | Target Location Coordinate | Time to Target Location |
|---|---|---|
| $5^{th}$ Floor | 5% | (0, 20, 25) | 20 s |
| $4^{th}$ Floor | 25% | (10, 20, 20) | 10 s |
| $3^{rd}$ Floor | 70% | (10, 20, 15) | 0 s |
| $2^{nd}$ Floor | 0% | n/a | n/a |
| $1^{st}$ Floor | 0% | n/a | n/a |

Moreover, as can be seen in Table 2, the predicted vertical movement model may include further details of the predicted vertical movement, such as target location coordinates, which may be the coordinates of the vertical access area on the floor. For example, stairs or escalators will shift the horizontal location of the vertical access area from floor to floor while an elevator will give produce the same horizontal (e.g., x,y) coordinates, while only changing the vertical coordinates (e.g., z). The target location coordinate serves as an accurate initial position for the mobile device on the new floor since the mobile device is bounded by the physical constraint of the vertical access area. The position estimate of the mobile device produced as the mobile device moves on the new floor may be based on the accurate initial position provided by the target location coordinate. Additionally, the predicted vertical movement model may provide a predicted transition time, e.g., such as 10 s for stairs or 1 s for an elevator per floor. The floor determination function may adjust the access point scan schedule or vertical transition sensor measurement schedule accordingly.

The predicted vertical movement model for a vertical access area may be generated based on criteria including occupant rate of each floor, floor usage, organizational connection across floors (e.g., companies or departments may be split across multiple floors), etc. For example, company A may rent floors 1, 2, and 5 of a building while company B may rent 3 and 4. Then, there will be a stronger connection (and thus mobility) within each floor group [floor 1, 2, 5] and [floor 3,4] while there is likely to be little movement across the floor groups. The various criteria may be weighted as appropriate to automatically generate a predicted vertical movement model for a vertical access area.

As an example, a basic reference model for a vertical access type, such as stairs, may be provided by the system designer as 50% for current floor, 20% for +1 floor, 10% for +2 floor, . . . . Additionally, user-generated information may also be considered, such as the floor group example, discussed above, with probabilities of, e.g., 90% within a floor group and 10% across floor groups. The predicted vertical movement model may be based on the combination of both models, which may be weighted if desired. As an example of combining multiple models, if a mobile device is at a vertical access area (stairs) on the first floor of the 5 floor building, where the basic reference model for the as stairs is provided as 50% for the current floor, 20% for +1 floor, 10% for +2 floor . . . , then the stair reference model may be $p_{model1}$=[Floor1 Floor2 Floor3 Floor4 Floor5]=[0.5 0.2 0.1 0.1 0.1]. The floor group information model, based on the probabilities of, e.g., 90% within a floor group and 10% across floor groups, may be $p_{model2}$=[Floor1 Floor2 Floor3 Floor4 Floor5]=[0.9 0.9 0.1 0.1 0.9], which is not normalized here, but the final probability may be normalized. By way of example, each model ($p_{model1}$ and $p_{model2}$, respectively) may be weighed $w_{model1}=1$ and $w_{model2}=0.1$, i.e., the floor group information is not trusted heavily, then the combined model $p_{combined}$ may be calculated as:

$$p_{combined}(j) = \frac{p_{model1}(j)^{w_{model1}} \times p_{model2}(j)^{w_{model2}}}{\sum_{k=1}^{N} p_{model1}(k)^{w_{model1}} \times p_{model2}(k)^{w_{model2}}} \quad \text{eq. 1}$$

where N is the number of floors and j is the index of a target floor. Then, $p_{combined}$=[0.5205 0.2082 0.0836 0.0836 0.1041], showing a similar probability distribution to the generic stair model. On the other hand, if $w_{model1}=1$ and $w_{model2}=10$, i.e., the floor group information is trusted heavily, then, $p_{combined}$=[0.6249999 995 0.249999999982 0.000000000035 0.000000000035 0.124999999991], showing a low likelihood that a mobile device will travel to floor 3 or floor 4 from floor 1. Similarly if there are any other probability models (e.g., building owner provided information), the equation may be further expanded to include cascade of them with assigned weighting such as:

$$p_{combined}(j) = \frac{\prod_{i=1}^{M} p_{modeli}(j)^{w_{modeli}}}{\sum_{k=1}^{N} \prod_{i=1}^{M} p_{modeli}(j)^{w_{modeli}}} \quad \text{eq. 2}$$

where M is the number of probability models combined.

The resulting predicted vertical movement model may be manually inspected and adjusted as appropriate prior to deployment, or alternatively may be manually generated.

Referring back to FIG. 2, assistance data for indoor positioning may be generated using the floor plan data, the vertical access area and the predicted vertical movement model for the vertical access area (208). The vertical probability provided by the predicted vertical movement model for the vertical access area may be provided, e.g., based on an area on the floor or based on a predefined grid of the floor. For example, in the first case, if there are two vertical access area in a floor, then the vertical probability may be specified only in for those two vertical access areas, which may be represented as geometric areas, e.g., circles (each having a center in x, y, z and radius), a rectangle (center or one corner and width and length), or any polygonal representation (a list of corner points). In the second case, the entire floor may be sampled by grids (either uniform or non-uniform) and for each grid, the vertical probability information may be provided. Thus, the grids outside of a vertical access area will have zero or near to zero probability while grids inside of vertical access area may contain higher probability as it gets closer to the center of vertical access area. If vertical access area type is identified, it may also be associated with the vertical access area in the assistance data. The assistance data may be stored, e.g., in the database 104 shown in FIG. 1. The assistance data may be provided to the mobile device 106 for indoor navigation.

The mobile device 106 may use the assistance data, along with measurements of received wireless signals from access points, e.g., RSSI and/or RTT, to estimate a position of the mobile device 106. If the estimated position of the mobile device 106 coincides with the vertical access area in the assistance data, the mobile device 106 is likely moving to a different floor. Accordingly, the indoor location based service may search the assistance data for the appropriate floor. This is typically accomplished by matching the mobile device's measurements of signals received from access points with the assistance data for different floors. The predicted vertical movement model associated with the vertical access area in the assistance data may be used to inform the decision as to which floor in the assistance data to search first, i.e., the floor with the highest probability is searched first, followed by floors with decreasing probability. For example, the mobile device 106 may determine if a floor determination is necessary or not, e.g., if it is near or in a vertical access area. If the mobile device 106 is in or near a vertical access area, a floor search may be performed, e.g., using an access point scan and/or vertical transition sensor. After the floor search, the mobile device 106 may use the floor determination results directly or may combine the floor determination results with the probability from the predicted vertical movement model vertical for the vertical access area. For example, $$p_{floor}(j) = \frac{p_{model1}(j)^{w_{model}} \times p_{meas}(j)^{w_{meas}}}{\sum_{k=1}^{N} p_{model1}(k)^{w_{model}} \times p_{meas}(k)^{w_{meas}}} \quad \text{eq. 3}$$

where $p_{floor}$ is the final transition probability, i.e., the probability that the mobile device 106 transitioned to a target floor j, $p_{model}$ is the given model probability, $p_{meas}$ is the measurement based probability based on the floor determination results, and N is the number of floors and j is the index of the target floor.

During use of the assistance data for indoor navigation (or at a later time if desired) the mobile device 106, as well as other mobile devices, may provide vertical access area feedback information to the server, which may then modify the assistance data as appropriate. The feedback information may be sent after each transition event or accumulated and sent to the server in a batch (per day or after leaving the venue). The feedback information may include information such as: transition location (x,y,z); transition destination (x,y,z) or (dx, dy, dz) based on location estimation; event type (0=no transition inside of vertical access area; 1=transition inside of vertical access area; 2=transition outside of vertical access area); transition time (e.g. 10 s in vertical movement to destination); and accurate vertical transition sensor reading (e.g., complete barometric record during transition, first and last barometer reading, or delta time and delta barometer reading (the barometric reading may be pre-converted into meters by the mobile device).

The feedback information may include: 1. Transition location (x,y,z); 2. Transition destination (x,y,z) or (dx, dy, dz) based on location estimation; 3. Event type (0: no transition inside of vertical access area; 1: transition inside of vertical access area; 2: transition outside of vertical access area); 4. Transition time (e.g. 10 s in vertical movement to destination); and 5. Accurate barometric reading (e.g., complete record during transition in series of time, first and last barometer reading, or delta time and delta barometer reading—the barometric reading could be pre-converted into meters by mobile device.

Figure 6:
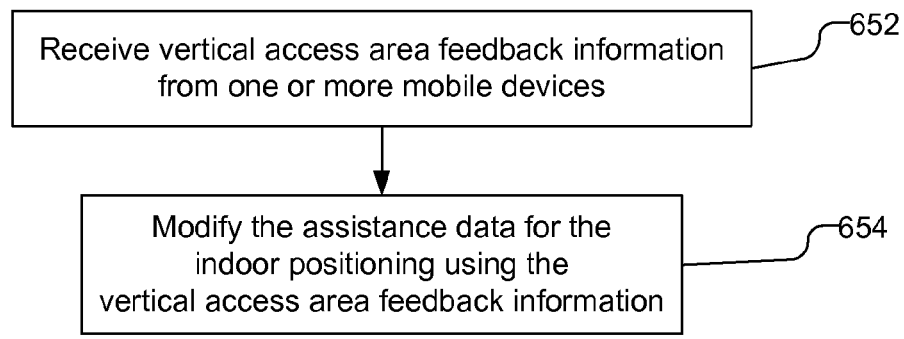
FIG. 6 is a flow chart illustrating a method of modifying assistance data for indoor based location services based on received vertical access area feedback information.

FIG. 6 is a flow chart illustrating a method of modifying assistance data for indoor based location services based on received vertical access area feedback information. As can be seen, vertical access area feedback information for a floor of a structure is received from one or more mobile devices (652). The assistance data for the indoor positioning is modified using the vertical access area feedback information (654). For example, the vertical access area feedback information may include an identification of one or more floors accessed by a vertical access area. If, over time, it is determined that the predicted vertical movement model for the vertical access area is inaccurate, i.e., does not accurately predict which floors are being accessed, the predicted vertical movement model in the assistance data may be modified appropriately.

Figure 7:
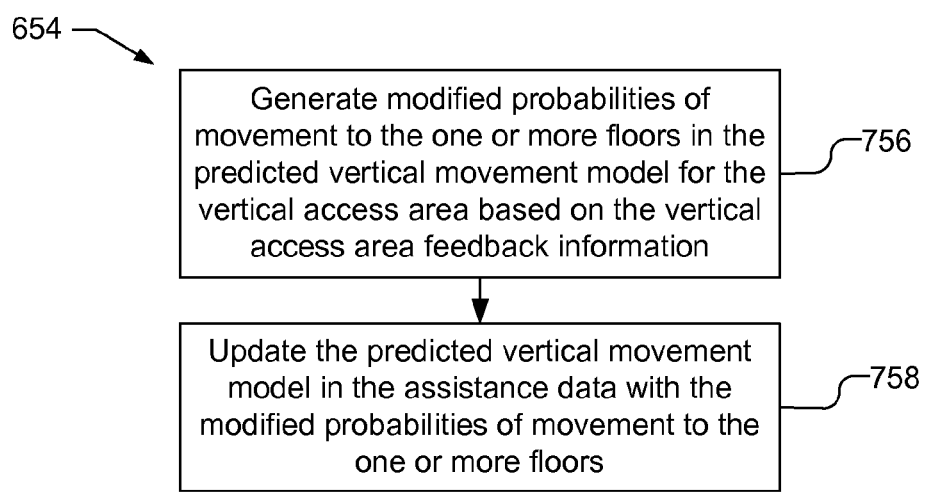
FIG. 7 is a flow chart illustrating a method of modifying assistance data.

FIG. 7, by way of example, is a flow chart illustrating a method of modifying the assistance data from step 654 in FIG. 6, where the vertical access area feedback information includes an identification of one or more floors accessed by the vertical access area. As illustrated, modified probabilities of movement to the one or more floors in the predicted vertical movement model for the vertical access area is generated based on the vertical access area feedback information (756). The predicted vertical movement model in the assistance data may be updated with the modified probabilities of movement to the one or more floors (758).

The update based on vertical access area feedback information can be performed as:

$$p_{newModel}(j) = \frac{p_{model}(j)w_{model} \times P_{FB}(j)w_{FB}}{\sum_{k=1}^{N}(p_{model}(k)w_{model} \times P_{FB}(k)w_{FB})} \qquad \text{eq. 4}$$

where $p_{newModel}$ is the updated predicted vertical movement model, while $p_{model}$ is the existing predicted vertical movement model, $p_{FB}$ is the vertical access area feedback information, and N is the number of floors and j is the index of a target floor. For example, in one day, there may be 20 transition reports for a vertical access area (in the first floor) and the number of occurrence per destination floor is [8, 4, 2, 2, 4]. Then, pFB=[0.4 0.2 0.1 0.1 0.2] (i.e. 40% of mobile devices stayed in the first floor, 20% of mobiles moved to 2nd floor, . . . ). Typically, the weight w can be given based on the number of reports. For example, $w_{model}$=min(0.9, max(0.5, number of accumulated FB reports/(number of accumulated FB reports+number of reports in current update epoch))) and $w_{FB}$=min(0.5, number of reports in current update epoch/(number of accumulated FB reports+number of reports in current update epoch)). To limit variation of the predicted vertical movement model, $w_{model}$ and $w_{FB}$ may be limited by upper/lower limits. Based on the iterative update of probability model, three types of correction may be made: update of existing access area, removal of existing vertical access area, and creation of a new vertical access area. The update of the predicted vertical movement model for the existing area is as described before. The removal of an existing vertical access area occurs if the sum of probability of transition to other floors is less than a removal threshold (e.g. 0.000001), meaning that there is a very low probability of movement to other floors from the location. Third, the creation of a new vertical access area will happen if sum of probability of transition to other floors is greater than a creation threshold (e.g. 0.05). The sum of probability of transition may be aggregated in a segment (e.g. 2 m by 2 m square area).

Thus, for example, it may be determined from received vertical access area feedback information that the $3^{rd}$ floor (the storage floor) in FIG. 3 is accessed by vertical access area 307a more than the $5^{th}$ floor. Accordingly, the probabilities of movement to the one or more floors in the predicted vertical movement model for vertical access area 307a may be modified as illustrated in Table 3 below and the predicted vertical movement model in the assistance data may be updated accordingly.

TABLE 3

|  | Vertical Access Area (307a) |
|---|---|
| $5^{th}$ Floor | 10% |
| $4^{th}$ Floor | 15% |
| $3^{rd}$ Floor | 20% |
| $2^{nd}$ Floor | 5% |
| $1^{st}$ Floor | 50% |

In another example, the vertical access area feedback information received from one or more mobile device may indicate that no other floors are accessed by a vertical access area. If, over time, it is determined that the vertical access area is not used to access other floors, the assistance data may be modified by invalidating the vertical access area in the assistance data. Alternatively, vertical access area may not be invalidated, but the probabilities of moving to another floor in the predicted vertical movement model for the vertical access area may be appropriately decreased.

In another example, the vertical access area feedback information received from one or more mobile device may indicate the presence of a vertical access area in an area that is not designated as a vertical access area in the assistance data. A predicted vertical movement model may be generated for the new vertical access area, e.g., based on the identification of the one or more floors accessed by the vertical access area as reported in the vertical access area feedback information. The assistance data may be modified by designating the area as a new vertical access area and providing the predicted vertical movement model for the new vertical access area.

Figure 8:
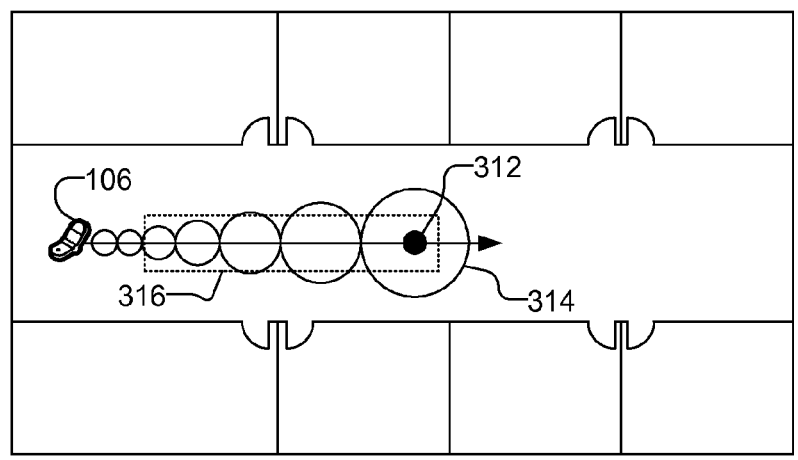
FIG. 8 illustrates a portion of the $3^{rd}$ floor of the multi-floor structure from FIG. 3 and shows an estimated position and an uncertainty in the estimated position (illustrated as circles of increasing size) as a mobile device moves along the $3^{rd}$ floor.

For example, referring to FIG. 3, a mobile device may have an estimated position 312 on the $3^{rd}$ floor, which is not a designated vertical access area. The mobile device, however, may determine that at estimated position 312, the signals received from access points do not match the signals for the $3^{rd}$ floor as provided by the assistance data, but match the signals at an estimated position 314 on the $4^{th}$ floor as provided by the assistance data. FIG. 8, by way of example, illustrates a portion of the $3^{rd}$ floor of the multi-floor structure 300 shown in FIG. 3 and shows the estimated position and an uncertainty in the estimated position (illustrated as circles of increasing size) as the mobile device 106 moves along the $3^{rd}$ floor. When the uncertainty exceeds a threshold, a search of the assistance data may be performed for floors that provide a better match of the received signals from available access points. Thus, for example, at estimated position 312, the uncertainty 314 exceeds the threshold, and a search of the assistance data indicates that that fourth floor is a better match of the received signals from available access points. Accordingly, it may be determined that the mobile device 106 has changed its vertical position from the $3^{rd}$ floor to the $4^{th}$ floor, and thus, a previously undesignated vertical access area must be present. The new vertical access area may be designated as including the estimated positions of the mobile device 106, e.g., from where the uncertainty in the estimated position begins to increase to where the uncertainty exceeds the threshold and the change in vertical position is detected. In FIG. 8, the new vertical access area 316, illustrated with dotted lines, is identified as including the positions with increasing uncertainty. Moreover, the predicted vertical movement model for the new vertical access area 316 may be based on the floor change information, e.g., the mobile device 106 moved from the 3$^{rd}$ floor to the 4$^{th}$ floor. With multiple reports from the same or different mobile devices with respect to the location and floor changes that occur at the new vertical access area 316, the location of the new vertical access area and the predicted vertical movement model may be further refined. Additionally, the type of vertical access area may be determined based on the number of floors changed and the motion type of the mobile device during the floor changes (e.g., vertical motion with no horizontal motion indicates an elevator, smooth vertical motion with horizontal motion indicates an escalator, or periodic vertical motion with horizontal motion indicates stairs). If desired, a tentative vertical access area may be created with a predicted vertical movement model before adding the new vertical access area in the assistance data. For example, the new vertical access area may be added to the assistance data only if a threshold is exceeded by the probability of floor change at the new vertical access area as determined based on vertical access area feedback information.

Figure 9A:
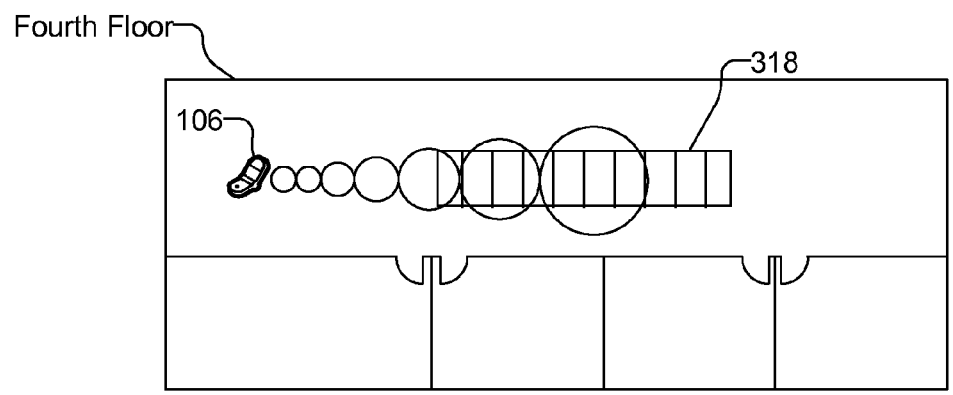
FIGS. 9A and 9B illustrate the reduction of horizontal uncertainty of the position estimate of a mobile device based on detection of a vertical movement event and the known position of the vertical access area.
Figure 9B:
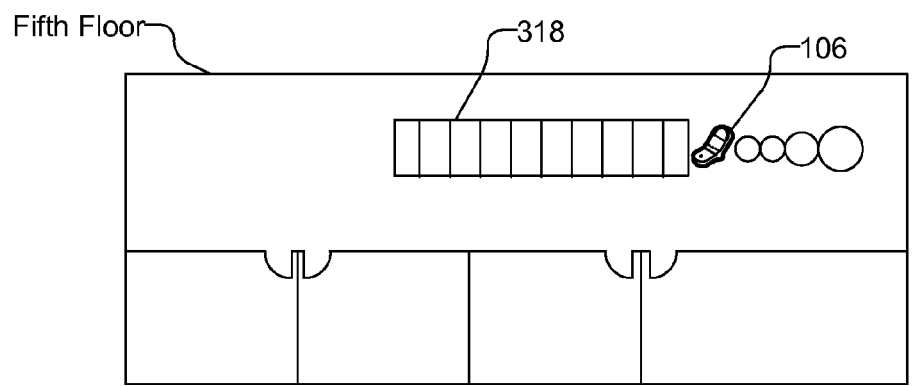

Additionally, after a vertical movement is confirmed, the horizontal uncertainty of the estimated position of the mobile device 106 decreases as the mobile device 106 is necessarily bounded by the target location coordinate of the vertical access area. For example, as illustrated in FIG. 9A, the position uncertainty of a mobile device 106 moving horizontally on, e.g., the fourth floor of a building, may increase, as illustrated by the circles of increasing size. Once the vertical movement is confirmed, and it is determined that the mobile device 106 is on the fifth floor of the building, the horizontal position of the mobile device 106 is bounded by the vertical access area, e.g., stairs 318 on the fifth floor, as illustrated by FIG. 9B. Thus, the mobile device 106 may begin navigating horizontally on the fifth floor from the known initial position determined by the physical constraint of the stairs, and as the mobile device 106 navigates, the horizontal uncertainty may gain grow. Thus, it can be seen that that the horizontal error in the position estimate of the mobile device 106 can be reduced based on a vertical movement event and the known position of the vertical access area.

Thus, the received vertical access area feedback information may be used in conjunction with the analysis of the floor plan data to detect vertical access areas and generate associated predicted vertical movement models for a multi-floor structure. Additionally, as described above, the received vertical access area feedback information may be used by itself to detect vertical access areas and generate associated predicted vertical movement models for a multi-floor structure.

Figure 10:
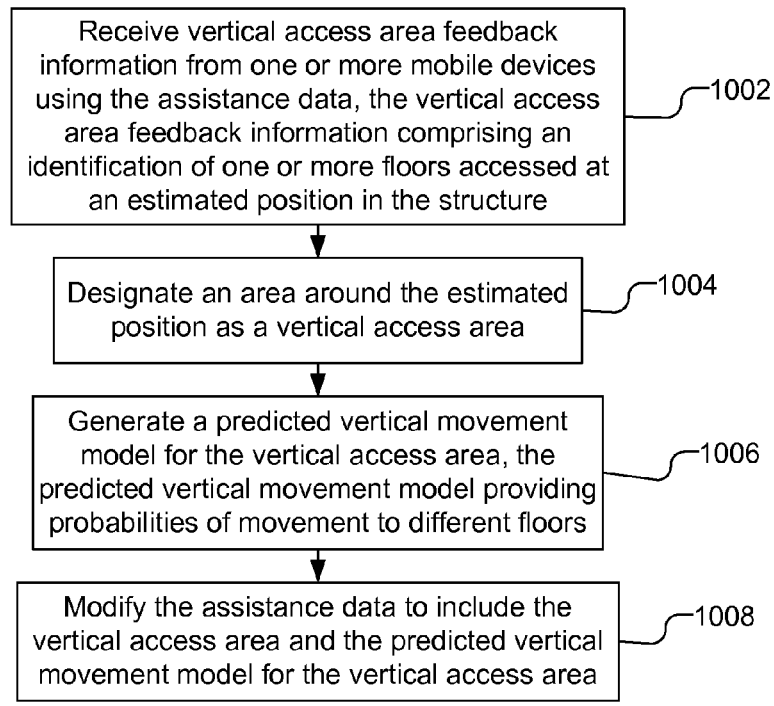
FIG. 10 is a flow chart illustrating a method of generating assistance data with designate vertical access areas and predicted vertical movement models for the vertical access areas based on received vertical access area feedback information.

FIG. 10 is a flow chart illustrating a method of generating assistance data with designate vertical access areas and predicted vertical movement models for the vertical access areas based on received vertical access area feedback information. As illustrated, vertical access area feedback information is received from one or more mobile devices using assistance data for indoor positioning for a structure having multiple floors (1002). The vertical access area feedback information may include an identification of one or more floors accessed at an estimated position in the structure. Thus, for example, as illustrated in FIG. 8, at an estimated position 312, the mobile device 106 accessed a different floor. The vertical access area feedback information may thus include the estimated position 312, as well as the one or more floors accessed at the estimated position 312. An area around the estimated position is designated as a vertical access area (1004), illustrated in FIG. 8 as vertical access area 316. A predicted vertical movement model for the vertical access area may then be generated (1006), as discussed. The predicted vertical movement model provides probabilities of movement to different floors. The assistance data is modified to include the vertical access area and the predicted vertical movement model for the vertical access area (1008). Additionally, as discussed above, the type of the vertical access area may be determined based on the vertical access area feedback information, and the vertical access area is associated with the vertical access type in the assistance data. The types of vertical access areas can be determined by the coordinates of new and old locations before and after a vertical transition and the transition time. For example, the horizontal position of an elevator, (x,y) stays the same while the vertical position (z) changes and the transition speed dz/dt (height change/transition time) should be relatively high. Both stairs and escalators, on the other hand, have changes in the horizontal position and vertical position (x,y,z). There will be, however, more variation in the transition time, dt, in stairs relative to a more constant transition time in the case of escalators.

Additionally vertical access feedback information may be received for the vertical access area and accordingly, modified probabilities of movement to the one or more floors is generated in the predicted vertical movement model for the vertical access area based on the vertical access area feedback information. The predicted vertical movement model in the assistance data may be updated with the modified probabilities of movement to the one or more floors.

Figure 11:
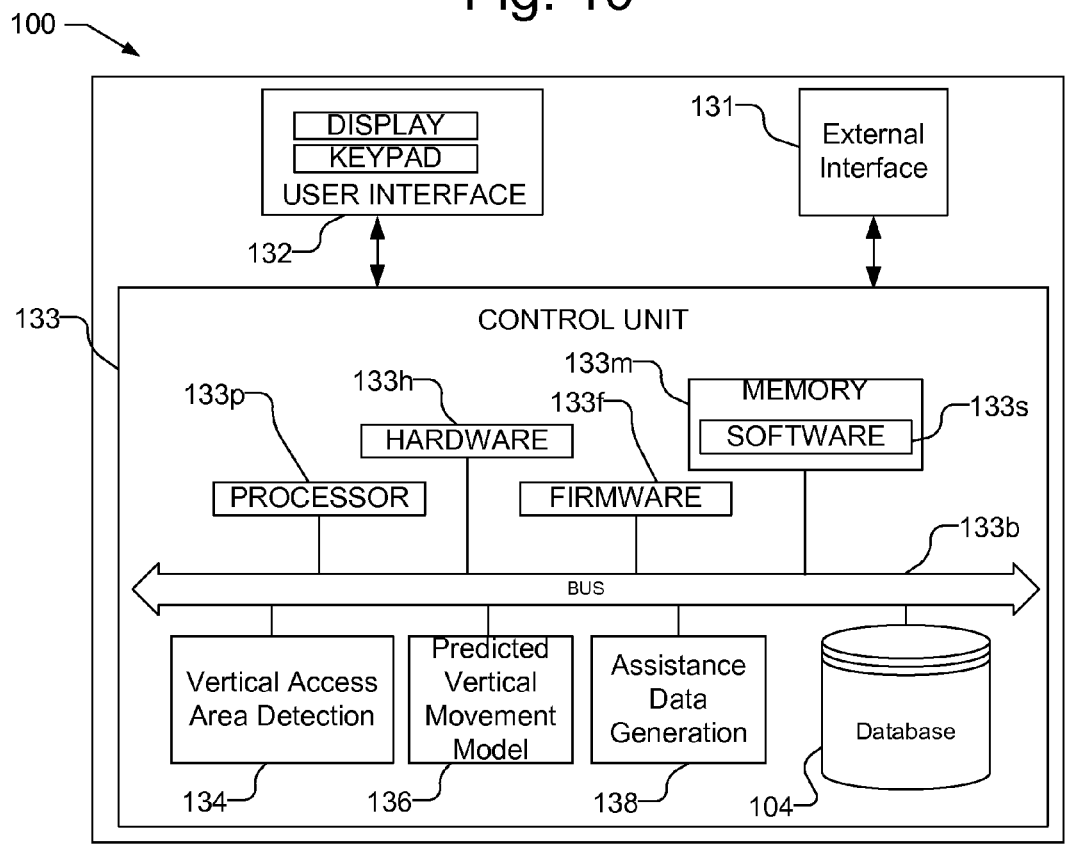
FIG. 11 is a block diagram of a server capable of generating assistance data with designated vertical access areas and predicted vertical movement models for the vertical access areas.

FIG. 11 is a block diagram of the server 100 capable of generating assistance data with designated vertical access areas and predicted vertical movement models for the vertical access areas as discussed herein. The server 100 includes an external interface 131 that may be capable of receiving the floor plan data for structures. The external interface 131 may also be capable of transmitting assistance data to mobile devices and receiving vertical access area feedback information from mobile devices. The server 100 may further include a user interface 132 that may include e.g., a display, as well as a keypad or other input device through which the user can input information into the server 100.

The external interface 131 may include one or more separate interface devices to receive the floor plan data and the vertical access area feedback information from mobile devices. For example, the external interface 131 may include a wired interface that is coupled to a router (not shown) and/or a wireless interface used in any various wireless communication networks such as a wireless wide area network (WWAN), a wireless local area network (WLAN), a wireless personal area network (WPAN), and so on. The term "network" and "system" are often used interchangeably. A WWAN may be a Code Division Multiple Access (CDMA) network, a Time Division Multiple Access (TDMA) network, a Frequency Division Multiple Access (FDMA) network, an Orthogonal Frequency Division Multiple Access (OFDMA) network, a Single-Carrier Frequency Division Multiple Access (SC-FDMA) network, Long Term Evolution (LTE), and so on. A CDMA network may implement one or more radio access technologies (RATs) such as cdma2000, Wideband-CDMA (W-CDMA), and so on. Cdma2000 includes IS-95, IS-2000, and IS-856 standards. A TDMA network may implement Global System for Mobile Communications (GSM), Digital Advanced Mobile Phone System (D-AMPS), or some other RAT. GSM and W-CDMA are described in documents from a consortium named "3rd Generation Partnership Project" (3GPP). Cdma2000 is described in documents from a consortium named "3rd Generation Partnership Project 2" (3GPP2). 3GPP and 3GPP2 documents are publicly available. A WLAN may be an IEEE 802.11x network, and a WPAN may be a Bluetooth® network, an IEEE 802.15x, or some other type of network. Moreover, any combination of WWAN, WLAN and/or WPAN may be used.

The server 100 also includes a control unit 133 that is connected to and communicates with the external interface 131. The control unit 133 accepts and analyzes the floor plane data as well as the vertical access area feedback information from mobile devices. The control unit 133 may be provided by a bus 133*b*, processor 133*p* and associated memory 133*m*, hardware 133*h*, firmware 133*f*, and software 133*s*. The control unit 133 is further illustrated as including a vertical access area detection module 134, which analyzes the floor plan data and may include an image processing module for object recognition based on a database of vertical access types stored in, e.g., memory 133*m*. The vertical access area detection module 134 may further analyze the vertical access area feedback information received from mobile devices to detect vertical access areas. A predicted vertical movement model module 136 may be used to generate the probabilities of movement to different floors of a structure by a detected vertical access area. Assistance data generation module generates the assistance data using received floor plan data, as well as a detected vertical access area and predicted vertical movement model for the detected vertical access area. The control unit 133 may then cause the assistance data may then be stored in database 104 and/or memory 133*m*.

The vertical access area detection module 134, predicted vertical movement model module 136, and assistance generation module 138 are illustrated separately from processor 133*p* for clarity, but may be part of the processor 133*p* or implemented in the processor based on instructions in the software 133*s* which is run in the processor 133*p*. Moreover, database 104 is illustrated as being within the control unit 133 and coupled directly to bus 133*b*, but may be external to the server 100 if desired.

It will be understood as used herein that the processor 133*p* can, but need not necessarily include, one or more microprocessors, embedded processors, controllers, application specific integrated circuits (ASICs), digital signal processors (DSPs), and the like. The term processor is intended to describe the functions implemented by the system rather than specific hardware. Moreover, as used herein the term "memory" refers to any type of computer storage medium, including long term, short term, or other memory associated with the mobile device, and is not to be limited to any particular type of memory or number of memories, or type of media upon which memory is stored.

The methodologies described herein may be implemented by various means depending upon the application. For example, these methodologies may be implemented in hardware 133*h*, firmware 133*f*, software 133*s*, or any combination thereof. For a hardware implementation, the processing units may be implemented within one or more application specific integrated circuits (ASICs), digital signal processors (DSPs), digital signal processing devices (DSPDs), programmable logic devices (PLDs), field programmable gate arrays (FPGAs), processors, controllers, micro-controllers, microprocessors, electronic devices, other electronic units designed to perform the functions described herein, or a combination thereof.

For a firmware and/or software implementation, the methodologies may be implemented with modules (e.g., procedures, functions, and so on) that perform the functions described herein. Any machine-readable medium tangibly embodying instructions may be used in implementing the methodologies described herein. For example, software codes may be stored in memory 133*m* and executed by the processor 133*p*. Memory 133*m* may be implemented within or external to the processor 133*p*. If implemented in firmware and/or software, the functions may be stored as one or more instructions or code on a computer-readable medium. Examples include non-transitory computer-readable media encoded with a data structure and computer-readable media encoded with a computer program. Computer-readable media includes physical computer storage media. A storage medium may be any available medium that can be accessed by a computer. By way of example, and not limitation, such computer-readable media can comprise RAM, ROM, EEPROM, CD-ROM or other optical disk storage, magnetic disk storage or other magnetic storage devices, or any other medium that can be used to store desired program code in the form of instructions or data structures and that can be accessed by a computer; disk and disc, as used herein, includes compact disc (CD), laser disc, optical disc, digital versatile disc (DVD), floppy disk and Blu-ray disc where disks usually reproduce data magnetically, while discs reproduce data optically with lasers. Combinations of the above should also be included within the scope of computer-readable media.

Thus, the server 100 includes a means for acquiring floor plan data for a structure having multiple floors, which may be, e.g., the external interface 131. Means for analyzing the floor plan data to detect a vertical access area on a floor may be, e.g., the vertical access area detection module 134. A means for generating a predicted vertical movement model for the vertical access area may be, e.g., the predicted vertical movement model module 136. A means for generating assistance data for indoor positioning based service using the floor plan data, the vertical access area and the predicted vertical movement model for the vertical access area may be, e.g., the assistance data generation module 138. Additionally, the server 100 may include means for receiving vertical access area feedback information from one or more mobile devices that are using the assistance data, which may be, e.g., the external interface 131. A means for modifying the assistance data for the indoor positioning using the vertical access area feedback information may be, e.g., the vertical access area detection module 134, predicted vertical movement model module 136, and assistance data generation module 138. For example, the vertical access area feedback information comprises an identification of one or more floors accessed by the vertical access area, wherein the means for modifying the assistance data for the indoor positioning using the vertical access area feedback information may be a means for generating modified probabilities of movement to the one or more floors in the predicted vertical movement model for the vertical access area based on the vertical access area feedback information, which may be, e.g., the predicted vertical movement model module 136, and a means for updating the predicted vertical movement model in the assistance data with the modified probabilities of movement to the one or more floors, which may be, e.g., the assistance data generation module 138. In another example, the vertical access area feedback information may indicate that no floors are accessed by the vertical access area and the means for modifying the assistance data may invalidate the vertical access area. In another example, the vertical access area feedback information may include identification of an area that is not a designated vertical access area in the assistance data, and the means for modifying the assistance data designates the area as a second vertical access area and provides a second predicted vertical movement model for the second vertical access area based on the identification of the one or more floors. Where the floor plan data includes floor plan images, the means for analyzing the floor plan data to detect the vertical access area, e.g., the vertical access area detection may perform image processing of the floor plan images to identify the vertical access area and vertical access type based on object recognition.

Additionally, the server 100 may include a means for receiving vertical access area feedback information from one or more mobile devices using the assistance data for indoor positioning for a structure having multiple floors, the vertical access area feedback information comprising an identification of one or more floors accessed at an estimated position in the structure, which may be, e.g., the external interface 131. A means for designating an area around the estimated position as a vertical access area may be, e.g., the vertical access area detection module 134. A means for generating a predicted vertical movement model for the vertical access area, the predicted vertical movement model providing probabilities of movement to different floors may be, e.g., the predicted vertical movement model module 136. A means for modifying the assistance data to include the vertical access area and the predicted vertical movement model for the vertical access area may be the assistance data generation module 138. The server 100 may further include means for identifying a vertical access type of the vertical access area from the vertical access area feedback information based on at least one of a position change and a transition time during a vertical transition at the vertical access area, which may be e.g., the vertical access area detection module 134.

Figure 12:
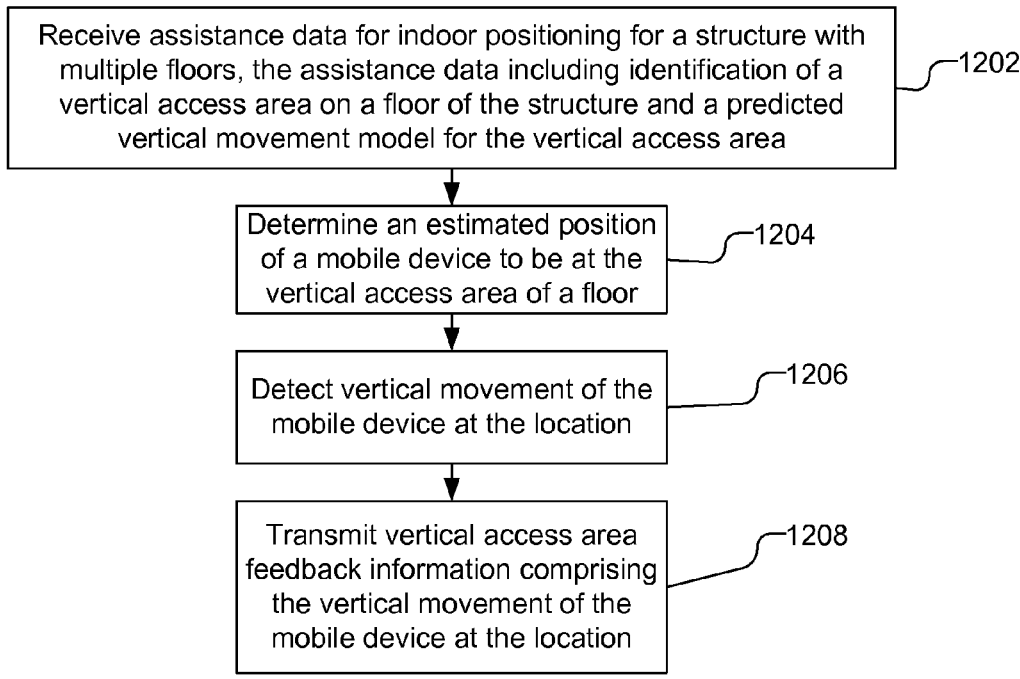
FIG. 12 is a flow chart illustrating a method performed by a mobile device to provide vertical access area feedback information to a server.

FIG. 12 is a flow chart illustrating a method performed by a mobile device to provide vertical access area feedback information to a server. As illustrated, a mobile device receives assistance data for indoor positioning for a structure with multiple floors (1202). The assistance data includes identification of a vertical access area on a floor of the structure and a predicted vertical movement model for the vertical access area. The predicted vertical movement model providing probabilities of movement to different floors by the vertical access area. An estimated position of the mobile device is determined to be at the vertical access area of a floor (1204). The estimated position is determined using conventional positioning or location based services that utilize the assistance data, as well as measurements, such as RSSI and/or RTT measurements, of wireless signals received from available access points. Vertical movement of the mobile device is detected at the estimated position (1206). For example, vertical movement may be detected using barometers or monitoring received signal from access points on different floors. If desired, the vertical movement of the mobile device may not be detected until an increase in an uncertainty in the position estimate for the mobile device exceeds a threshold. For example, the vertical position of the mobile device may be presumed by the location based service to be at the floor with the highest probability in the predicted vertical movement model for the vertical access area. An uncertainty in the position estimate that exceeds a threshold may indicate that the mobile device is on an unexpected floor, and thus, the vertical movement of the mobile device may then be detected. If desired, a floor determination function, e.g., using signals from access points or a barometer may be periodically turned on while the mobile device moves on the floor and may be turned on when the estimated position of the mobile device coincides with the designated vertical access area. Additionally, the transmitted vertical movement of the mobile device may include the number of floors changed at the location. The vertical access area feedback information including the vertical movement of the mobile device at the estimated position may be transmitted (1208).

Additionally, vertical movement of the mobile device may be detected at a different estimated position that is not designated as vertical access area in the assistance data. The vertical movement of the mobile device at the different estimated position may be transmitted as vertical access area feedback information. By way of example, as described above, the vertical movement of the mobile device at the different estimated position may be detected by monitoring an increase in an uncertainty in a position estimate for the mobile device. When the uncertainty is greater than a threshold, the mobile device may be determined to be on an unexpected floor, and thus, the vertical movement of the mobile device may then be detected.

Figure 13:
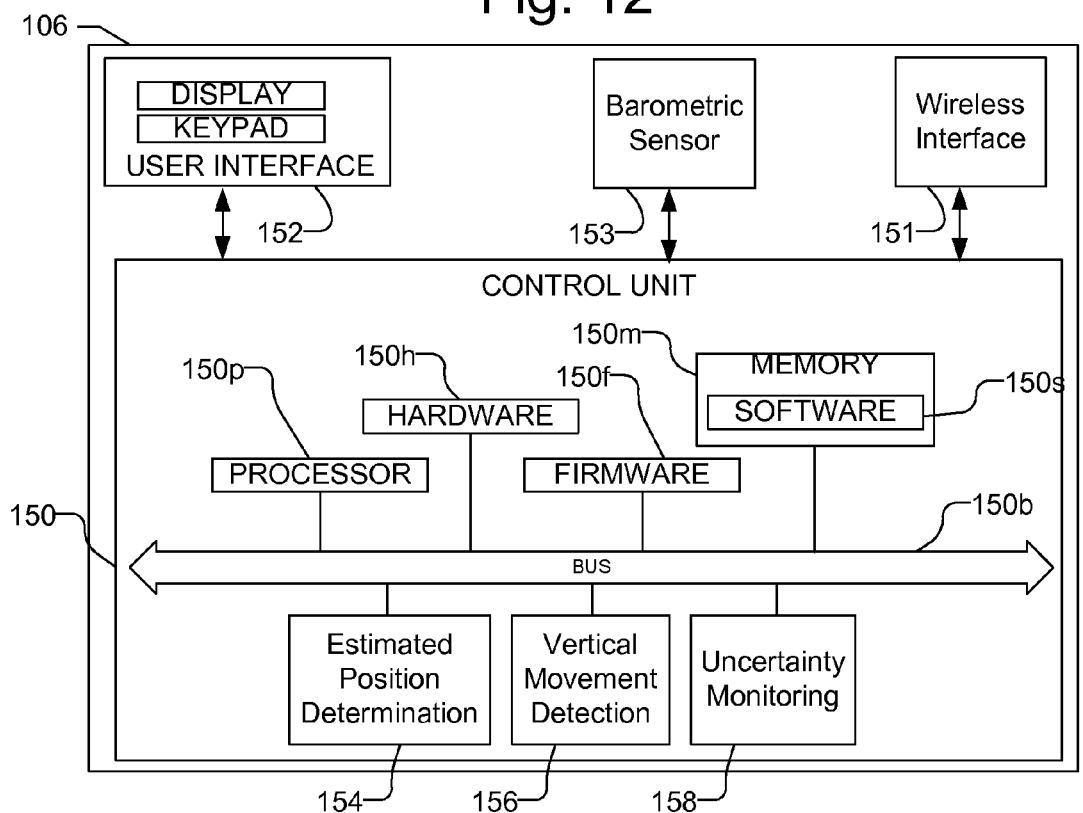
FIG. 13 is a block diagram of a mobile device capable of providing vertical access area feedback information to a server.

FIG. 13 is a block diagram of a mobile device 106 capable of providing vertical access area feedback information to a server. The mobile device 106 includes a wireless interface 151 that is used to communicate with a remote server, e.g., to transmit the vertical access area feedback information as well as to receive assistance data. The mobile device 106 may further include a user interface 152 that may include e.g., a display, as well as a keypad or other input device through which the user can input information into the mobile device 106. The mobile device 106 may include hardware to detect vertical transitions, such as barometric sensor 153.

The wireless interface 151 may be used in any various wireless communication networks such as a wireless wide area network (WWAN), a wireless local area network (WLAN), a wireless personal area network (WPAN), and so on. The term "network" and "system" are often used interchangeably. A WWAN may be a Code Division Multiple Access (CDMA) network, a Time Division Multiple Access (TDMA) network, a Frequency Division Multiple Access (FDMA) network, an Orthogonal Frequency Division Multiple Access (OFDMA) network, a Single-Carrier Frequency Division Multiple Access (SC-FDMA) network, Long Term Evolution (LTE), and so on. A CDMA network may implement one or more radio access technologies (RATs) such as cdma2000, Wideband-CDMA (W-CDMA), and so on. Cdma2000 includes IS-95, IS-2000, and IS-856 standards. A TDMA network may implement Global System for Mobile Communications (GSM), Digital Advanced Mobile Phone System (D-AMPS), or some other RAT. GSM and W-CDMA are described in documents from a consortium named "3rd Generation Partnership Project" (3GPP). Cdma2000 is described in documents from a consortium named "3rd Generation Partnership Project 2" (3GPP2). 3GPP and 3GPP2 documents are publicly available. A WLAN may be an IEEE 802.11x network, and a WPAN may be a Bluetooth® network, an IEEE 802.15x, or some other type of network. Moreover, any combination of WWAN, WLAN and/or WPAN may be used.

The mobile device 106 also includes a control unit 150 that is connected to and communicates with the wireless interface 151. The control unit 150 accepts and processes data obtained from wireless interface 151 and causes the wireless interface 151 to transmit vertical access area feedback information. The control unit 150 may be provided by a bus 150b, processor 150p and associated memory 150m, hardware 150*h*, firmware 150*f*, and software 150*s*. The control unit 150 is further illustrated as including an estimated position determination module 154 that determines an estimated position of the mobile device using assistance data received by the wireless interface 151 as well as wireless signals from access points received by the wireless interface 151. The estimated position determination module 154 may include, e.g., an RSSI measurement device and/or an RTT measurement device. The estimated position determination module 154 further determines whether the estimated position of the mobile device 106 is in a vertical access area identified in the received assistance data. The control unit 150 may further include a vertical movement detection module 156 to detect vertical movement of the mobile device. The vertical movement detection module 156 may compare, e.g., RSSI and/or RTT measurements of wireless signals received by the wireless interface 151 to the assistance data to determine a floor that the mobile device 106 is on. The vertical movement detection module 156 may additionally or alternatively include a barometer to determine the vertical position of the mobile device 106. The control unit 150 may also include an uncertainty monitoring module 158 that monitors the uncertainty in position estimates for the mobile device 106 to determine if the mobile device may be on an unexpected floor, e.g., which may be indicated if the uncertainty exceeds a threshold.

The estimated position determination module 154, vertical movement detection module 156, and uncertainty monitoring module 158 are illustrated separately from processor 150*p* for clarity, but may be part of the processor 150*p* or implemented in the processor based on instructions in the software 150*s* which is run in the processor 150*p*. It will be understood as used herein that the processor 150*p* can, but need not necessarily include, one or more microprocessors, embedded processors, controllers, application specific integrated circuits (ASICs), digital signal processors (DSPs), and the like. The term processor is intended to describe the functions implemented by the system rather than specific hardware. Moreover, as used herein the term "memory" refers to any type of computer storage medium, including long term, short term, or other memory associated with the mobile device, and is not to be limited to any particular type of memory or number of memories, or type of media upon which memory is stored.

The methodologies described herein may be implemented by various means depending upon the application. For example, these methodologies may be implemented in hardware 150*h*, firmware 150*f*, software 150*s*, or any combination thereof. For a hardware implementation, the processing units may be implemented within one or more application specific integrated circuits (ASICs), digital signal processors (DSPs), digital signal processing devices (DSPDs), programmable logic devices (PLDs), field programmable gate arrays (FPGAs), processors, controllers, micro-controllers, microprocessors, electronic devices, other electronic units designed to perform the functions described herein, or a combination thereof.

For a firmware and/or software implementation, the methodologies may be implemented with modules (e.g., procedures, functions, and so on) that perform the functions described herein. Any machine-readable medium tangibly embodying instructions may be used in implementing the methodologies described herein. For example, software codes may be stored in memory 150*m* and executed by the processor 150*p*. Memory 150*m* may be implemented within or external to the processor 150*p*. If implemented in firmware and/or software, the functions may be stored as one or more instructions or code on a computer-readable medium. Examples include non-transitory computer-readable media encoded with a data structure and computer-readable media encoded with a computer program. Computer-readable media includes physical computer storage media. A storage medium may be any available medium that can be accessed by a computer. By way of example, and not limitation, such computer-readable media can comprise RAM, ROM, EEPROM, CD-ROM or other optical disk storage, magnetic disk storage or other magnetic storage devices, or any other medium that can be used to store desired program code in the form of instructions or data structures and that can be accessed by a computer; disk and disc, as used herein, includes compact disc (CD), laser disc, optical disc, digital versatile disc (DVD), floppy disk and Blu-ray disc where disks usually reproduce data magnetically, while discs reproduce data optically with lasers. Combinations of the above should also be included within the scope of computer-readable media.

The mobile device 106 may include means for receiving assistance data for indoor positioning for a structure with multiple floors, which may be the wireless interface 151. A means for determining an estimated position of a mobile device to be at the vertical access area may be, e.g., the estimated position determination module 154. Means for detecting vertical movement of the mobile device at the estimated position may be, e.g., the vertical movement detection module 156. A means for transmitting vertical access area feedback information comprising the vertical movement of the mobile device at the estimated position may be, e.g., the wireless interface 151. The mobile device 106 may further include a means for monitoring an increase in an uncertainty in a position estimate for the mobile device as the mobile device moves from the vertical access area indicating that the mobile device is on an unexpected floor, which may be, e.g., the uncertainty monitoring module 158. The mobile device 106 may further include a means for reducing the uncertainty in the position estimate for the mobile device based on detection of the vertical movement and a known position of the vertical access area on a new floor, which may be, e.g., the uncertainty monitoring module 158 and the estimated position determination module 154.

Although specific embodiments are provided herein for instructional purposes, the described embodiments are not limiting. Various adaptations and modifications may be made without departing from the scope of the present disclosure. Therefore, the spirit and scope of the appended claims should not be limited to the foregoing description.

What is claimed is:

1. A method comprising:
   receiving vertical access area feedback information from one or more mobile devices using assistance data for indoor positioning for a structure having multiple floors, the vertical access area feedback information comprising an identification of one or more floors accessed at an estimated position in the structure;
   designating an area around the estimated position as a vertical access area;
   generating a predicted vertical movement model for the vertical access area, the predicted vertical movement model providing probabilities of movement to different floors; and
   modifying the assistance data to include the vertical access area and the predicted vertical movement model for the vertical access area.

2. The method of claim 1, further comprising identifying a vertical access type of the vertical access area based on the vertical access area feedback information, wherein the vertical access type is selected from a group consisting of elevator, stairs and escalator, and wherein the vertical access area is associated with the vertical access type in the assistance data.

3. The method of claim 1, further comprising:
receiving additional vertical access feedback information for the vertical access area;
generating modified probabilities of movement to the different floors in the predicted vertical movement model for the vertical access area based on the vertical access area feedback information; and
updating the predicted vertical movement model in the assistance data with the modified probabilities of movement to the different floors.

4. The method of claim 1, further comprising:
acquiring floor plan data for the structure;
analyzing the floor plan data to detect vertical access areas;
generating the assistance data using the floor plan data and the detected vertical access areas.

5. The method of claim 4, wherein the floor plan data comprises floor plan images, and wherein analyzing the floor plan data to detect the vertical access areas comprises performing image processing of the floor plan images to identify the vertical access areas based on object recognition.

6. The method of claim 5, wherein image processing the floor plan images comprises pattern matching the floor plan images using a database of vertical access types.

7. The method of claim 4, wherein the estimated position in the feedback information is not a designated vertical access area in the assistance data, wherein modifying the assistance data comprises designating the estimated position as the vertical access area.

8. The method of claim 4, further comprising identifying a vertical access type of the vertical access area from the vertical access area feedback information based on at least one of a position change and a transition time during a vertical transition at the vertical access area.

9. An apparatus comprising:
an external interface capable of receiving vertical access area feedback information from mobile devices; and
a processor coupled to the external interface, the processor being configured to receive by the external interface vertical access area feedback information from one or more mobile devices using assistance data for indoor positioning for a structure having multiple floors, the vertical access area feedback information comprising an identification of one or more floors accessed at an estimated position in the structure; designate an area around the estimated position as a vertical access area; generate a predicted vertical movement model for the vertical access area, the predicted vertical movement model providing probabilities of movement to different floors; and modify the assistance data to include the vertical access area and the predicted vertical movement model for the vertical access area.

10. The apparatus of claim 9, the processor further configured to identify a vertical access type of the vertical access area based on the vertical access area feedback information, wherein the vertical access type is selected from a group consisting of elevator, stairs and escalator, and wherein the vertical access area is associated with the vertical access type in the assistance data.

11. The apparatus of claim 9, wherein the processor is further configured to receive by the external interface additional vertical access feedback information for the vertical access area; generate modified probabilities of movement to the different floors in the predicted vertical movement model for the vertical access area based on the vertical access area feedback information; and update the predicted vertical movement model in the assistance data with the modified probabilities of movement to the different floors.

12. The apparatus of claim 9, wherein the processor is further configured to acquire floor plan data for the structure; analyze the floor plan data to detect vertical access areas; generate the assistance data using the floor plan data and the detected vertical access areas.

13. The apparatus of claim 12, wherein the floor plan data comprises floor plan images, and wherein the processor is configured to analyze the floor plan data to detect the vertical access areas by being configured to perform image processing of the floor plan images to identify the vertical access areas based on object recognition.

14. The apparatus of claim 13, wherein the processor is configured to perform image processing by being configured to perform pattern matching of the floor plan images using a database of vertical access types.

15. The apparatus of claim 12, wherein the estimated position in the feedback information is not a designated vertical access area in the assistance data, wherein the processor is configured to modify the assistance data by being configured to designate the estimated position as the vertical access area.

16. The apparatus of claim 12, wherein the processor is further configured to identify a vertical access type of the vertical access area from the vertical access area feedback information based on at least one of a position change and a transition time during a vertical transition at the vertical access area.

17. A method comprising:
receiving assistance data for indoor positioning for a structure with multiple floors, the assistance data including identification of a vertical access area on a floor of the structure and a predicted vertical movement model for the vertical access area, the predicted vertical movement model providing probabilities of movement to different floors by the vertical access area;
determining an estimated position of a mobile device to be at the vertical access area;
detecting vertical movement of the mobile device at the estimated position; and
transmitting vertical access area feedback information comprising the vertical movement of the mobile device at the estimated position.

18. The method of claim 17, wherein transmitting vertical access area feedback information comprising the vertical movement of the mobile device at the estimated position comprises reporting an identification of the floor accessed by the vertical access area.

19. The method of claim 17, wherein before detecting the vertical movement of the mobile device, the method comprises monitoring an increase in an uncertainty in a position estimate for the mobile device as the mobile device moves from the vertical access area indicating that the mobile device is on an unexpected floor.

20. The method of claim 19, further comprising reducing the uncertainty in the position estimate for the mobile device based on detection of the vertical movement and a known position of the vertical access area on a new floor.

21. The method of claim 17, further comprising turning on a floor determination function when the mobile device is at the estimated position.

22. The method of claim 17, wherein detecting the vertical movement of the mobile device comprises monitoring a barometer or monitoring available access points.

23. The method of claim 17, further comprising
detecting vertical movement of the mobile device at a different estimated position that is not a designated vertical access area in the assistance data; and
transmitting vertical access area feedback information comprising the vertical movement of the mobile device at the different estimated position.

24. The method of claim 23, wherein before detecting the vertical movement of the mobile device at the different estimated position, the method comprises monitoring an increase in an uncertainty in a position estimate for the mobile device as the mobile device moves from the different estimated position indicating that the mobile device is on an unexpected floor.

25. The method of claim 17, further comprising:
monitoring an increase in an uncertainty in a position estimate for the mobile device as the mobile device moves from the vertical access area indicating that the mobile device is on an unexpected floor; and
in response to the uncertainty exceeding a threshold, searching the assistance data for floors that provide a better match of signals received from scans of access points.

26. The method of claim 17, wherein the processor is configured to:
monitor an increase in an uncertainty in a position estimate for the mobile device as the mobile device moves from the vertical access area indicating that the mobile device is on an unexpected floor; and
in response to the uncertainty exceeding a threshold, search the assistance data for floors that provide a better match of signals received from scans of access points.

27. A mobile device comprising:
a wireless interface;
a processor coupled to the wireless interface, the processor being configured to receive assistance data for indoor positioning for a structure with multiple floors, the assistance data including identification of a vertical access area on a floor of the structure and a predicted vertical movement model for the vertical access area, the predicted vertical movement model providing probabilities of movement to different floors by the vertical access area; determine an estimated position of the mobile device to be at the vertical access area based on the assistance data and wireless signals received by the wireless interface; detect vertical movement of the mobile device at the estimated position based on the assistance data and wireless signals received by the wireless interface; and to cause the wireless interface to transmit vertical access area feedback information comprising the vertical movement of the mobile device at the estimated position.

28. The mobile device of claim 27, wherein the vertical movement of the mobile device at the estimated position comprises an identification of the floor accessed by the vertical access area.

29. The mobile device of claim 27, wherein the processor is further configured to monitor an increase in an uncertainty in a position estimate for the mobile device as the mobile device moves from the vertical access area indicating that the mobile device is on an unexpected floor before the processor detects the vertical movement of the mobile device.

30. The mobile device of claim 29, wherein the processor is further configured to reduce the uncertainty in the position estimate for the mobile device based on detection of the vertical movement and a known position of the vertical access area on a new floor.

31. The mobile device of claim 27, wherein the processor is further configured to detect vertical movement of the mobile device at a different estimated position that is on an unexpected floor, and to cause the wireless interface to transmit the vertical movement of the mobile device at the different estimated position.

32. A method comprising:
receiving assistance data for indoor positioning for a structure with multiple floors, the assistance data including identification of a vertical access area on a floor of the structure and a predicted vertical movement model for the vertical access area, the predicted vertical movement model providing probabilities of movement to different floors by the vertical access area;
determining an estimated position of a mobile device to be at the vertical access area; and
turning on at least one vertical transition sensor or adjusting a schedule for performing scans of access points in response to the estimated position being determined to be at the vertical access area.

33. The method of claim 32, further comprising detecting vertical movement of the mobile device at the estimated position, wherein detecting the vertical movement comprises performing a floor search based on the probabilities of movement to different floors provided by the predicted vertical movement model.

34. The method of claim 33, wherein performing the floor search comprises monitoring the vertical transition sensor or signals received from scans of access points.

35. The method of claim 32, wherein the vertical transition sensor comprises a barometer.

36. The method of claim 32, wherein determining the estimated position of the mobile device to be at the vertical access area comprises determining that the mobile device is inside or less than a set distance away from the vertical access area.

37. The method of claim 32, wherein adjusting the schedule for performing scans of access points comprises increasing a frequency of performing scans of access points on other floors.

38. A mobile device comprising:
a wireless interface;
a vertical transition sensor; and
a processor coupled to the wireless interface and the vertical transition sensor, the processor being configured to receive assistance data for indoor positioning for a structure with multiple floors, the assistance data including identification of a vertical access area on a floor of the structure and a predicted vertical movement model for the vertical access area, the predicted vertical movement model providing probabilities of movement to different floors by the vertical access area; determine an estimated position of the mobile device to be at the vertical access area based on the assistance data and wireless signals received by the wireless interface; turn on the vertical transition sensor or adjust a schedule for performing scans of access points using the wireless interface in response to the estimated position being determined to be at the vertical access area.

39. The mobile device of claim 38, wherein the processor is further configured to detect vertical movement of the mobile device at the estimated position by performing a floor search based on the probabilities of movement to different floors provided by the predicted vertical movement model.

40. The mobile device of claim 38, wherein the processor is further configured to perform the floor search by monitoring the vertical transition sensor or signals received from scans of access points.

41. The mobile device of claim 38, wherein the vertical transition sensor comprises a barometer.

42. The mobile device of claim 38, wherein the processor is configured to determine the estimated position of the mobile device to be at the vertical access area by determining that the mobile device is inside or less than a set distance away from the vertical access area.

43. The mobile device of claim 38, wherein the processor is configured to adjust the schedule for performing scans of access points by being configured to increase a frequency of performing scans of access points on other floors.

* * * * *